United States Patent
Pilo et al.

(10) Patent No.: US 9,311,978 B2
(45) Date of Patent: Apr. 12, 2016

(54) REGULATED POWER GATING FOR GROWABLE MEMORY

(71) Applicant: INTERNATIONAL BUSINESS MACHINES CORPORATION, Armonk, NY (US)

(72) Inventors: Harold Pilo, Underhill, VT (US); Richard S. Wu, Winooski, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 115 days.

(21) Appl. No.: 14/061,112

(22) Filed: Oct. 23, 2013

(65) Prior Publication Data

US 2015/0109873 A1    Apr. 23, 2015

(51) Int. Cl.
*G11C 5/14* (2006.01)
*G11C 8/12* (2006.01)

(52) U.S. Cl.
CPC . *G11C 8/12* (2013.01); *G11C 5/148* (2013.01)

(58) Field of Classification Search
USPC ......................................................... 365/226
See application file for complete search history.

(56) References Cited

U.S. PATENT DOCUMENTS

| | | | |
|---|---|---|---|
| 7,447,923 B2 * | 11/2008 | Bose | G06F 9/382 713/300 |
| 2007/0043960 A1 * | 2/2007 | Bose | G09F 9/382 713/300 |
| 2007/0070769 A1 * | 3/2007 | Braceras | G11C 11/417 365/226 |
| 2007/0201295 A1 | 8/2007 | Lines | |
| 2009/0129192 A1 | 5/2009 | Barth, Jr. et al. | |
| 2009/0231931 A1 * | 9/2009 | Lines | G11C 5/14 365/189.11 |
| 2010/0142292 A1 * | 6/2010 | Ware | G11C 5/14 365/189.17 |
| 2010/0214863 A1 | 8/2010 | Chan et al. | |
| 2011/0292754 A1 | 12/2011 | Chan et al. | |
| 2013/0128684 A1 * | 5/2013 | Buettner | G11C 5/14 365/227 |
| 2013/0314977 A1 * | 11/2013 | Wang | G11C 11/412 365/156 |
| 2014/0035618 A1 * | 2/2014 | Tatsumura | G11C 15/04 326/41 |
| 2014/0334238 A1 * | 11/2014 | Ware | G11C 5/14 365/189.14 |
| 2015/0049568 A1 * | 2/2015 | Thyagarajan | G11C 8/08 365/230.01 |
| 2015/0077170 A1 * | 3/2015 | Bose | H02J 1/00 327/427 |

FOREIGN PATENT DOCUMENTS

EP    284276    9/1988

OTHER PUBLICATIONS

Chen et al, "An Ultra-Low-Power Memory With a Subthreshold Power Supply Voltage" IEEE Journal of Solid-State Circuits, vol. 41(10), pp. 2344-2353, 2006.

Hamzaolu, et al., "A 153Mb-SRAM Design with Dynamic Stability Enhancement and Leakage Reduction in 45nm Hihg-K Metal-Gate CMOS Technology", ISSCC, Feb. 5, 2008; 27 pages.

* cited by examiner

*Primary Examiner* — Hoai V Ho
*Assistant Examiner* — Pablo Huerta
(74) *Attorney, Agent, or Firm* — David Cain; Andrew M. Calderon; Roberts Mlotkowski Safran & Cole, P.C.

(57) ABSTRACT

A circuit for an integrated circuit power gating system includes a header device connected to a bank of a segmented memory array. The circuit is structured and arranged to: apply a ground input to a gate of the header device to activate the bank, and apply a regulated voltage to the gate of the header device to deactivate the bank. The circuit also includes a precharge circuit that charges the gate of the header device to a precharge voltage that is greater than ground and less than the regulated voltage.

16 Claims, 7 Drawing Sheets

REGULATED POWER GATING FOR GROWABLE MEMORY

FIELD OF THE INVENTION

The invention relates to integrated circuit memory and, more particularly, to power gating in integrated circuit memory.

BACKGROUND

Power gating is a technique used in integrated circuit design to reduce power consumption. Power gating is commonly used in integrated circuit memory arrays to reduce standby or leakage power by shutting off current to blocks of the memory that are not in use.

Early implementations of power gating use a constant threshold voltage drop across a power gating device to temporarily deactivate a portion of a circuit. These so-called diode-connected implementations provide sufficient power savings in larger technology nodes (e.g., 45 nm, 32 nm, 22 nm) where leakage increases exponentially with supply voltage. However, in newer technology nodes where leakage is more linearly related to supply voltage, the diode-connected implementations do not deliver sufficient power savings. For example, a diode-connected power gating scheme used in a memory array with 22 nm devices provides a 200 mv voltage drop of array power supply, which corresponds to a 53% leakage reduction for pull-up/pull-down and a 49% total bitcell leakage reduction. On the other hand, a similar diode-connected power gating scheme used in a memory array with 14 nm finFET technology provides only a 20% leakage reduction for pull-up/pull-down and a 15% total bitcell leakage reduction.

SUMMARY

In a first aspect of the invention, there is a circuit for an integrated circuit power gating system. The circuit includes a header device connected to a bank of a segmented memory array. The circuit is structured and arranged to: apply a ground input to a gate of the header device to activate the bank, and apply a regulated voltage to the gate of the header device to deactivate the bank. The circuit also includes a precharge circuit that charges the gate of the header device to a precharge voltage that is greater than ground and less than the regulated voltage.

In another aspect of the invention, there is an integrated circuit power gating system that includes a segmented memory array comprising a plurality of banks. The system also includes a respective header circuit associated with each respective one of the plurality of banks. Each said respective header circuit comprises a header device connected to an associated one of the plurality of banks. Each said respective header circuit is structured and arranged to: apply a ground input to a gate of the header device to activate the associated one of the plurality of banks, and apply a regulated voltage to the gate of the header device to deactivate the associated one of the plurality of banks. Each said respective header circuit comprises a precharge circuit that charges the gate of the header device to a precharge voltage that is greater than ground and less than the regulated voltage.

In another aspect of the invention, there is a method of power gating in an integrated circuit. The method includes precharging a gate of a header device connected to a bank of a segmented memory array prior to applying a regulated voltage to the gate of the header device. The precharging raises the gate of the header device to a voltage level greater than ground and less than the regulated voltage.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a circuit for an integrated circuit power gating system which comprises the structures of the present invention. In still further embodiments, a method in a computer-aided design system is provided for generating a functional design model of a circuit for an integrated circuit power gating system. The method comprises generating a functional representation of the structural elements of the circuit for an integrated circuit power gating system.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to integrated circuit memory and, more particularly, to power gating in integrated circuit memory. According to aspects of the invention, there is a power gating system and method for a segmented memory array that has its supply current reduced in unselected arrays. In embodiments, a respective single header device in each segmented memory array is configured to receive a ground input in a selected state, and to receive a controlled (e.g., regulated) gate voltage in an unselected state. In aspects, each segmented memory array has a header control circuit that pre-charges the gate of its respective header device to a voltage close to the anticipated controlled gate voltage prior to connecting the gate to the controlled gate voltage bus.

In accordance with aspects of the invention, the controlled gate voltage is generated by a feedback control circuit having a sample memory array, a sample header device and a reference-voltage input generator. In embodiments, the reference voltage is applied to the sample array through a unity gain regulator with a PFET supply device. The gate of the PFET supply device is mirrored throughout the memory to supply a controlled gate-voltage bus. In aspects, the sample memory array size is compiled to scale with the actual segmented memory arrays to provide an accurate mimic array. Implementations of the invention reduce the load in a feedback control circuit by pre-charging the gates.

Figure 1:
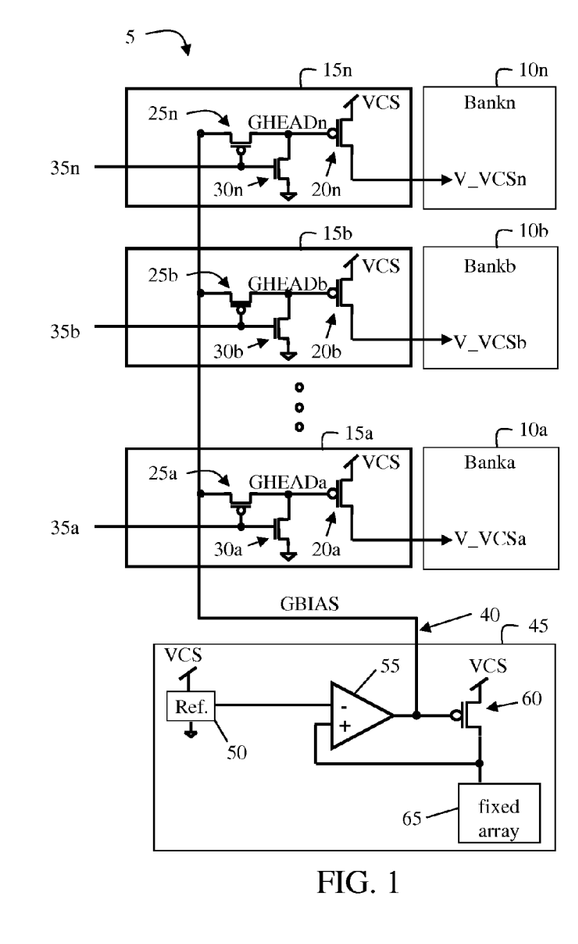
FIG. 1 shows a block diagram of an exemplary power gating system in an integrated circuit.

FIG. 1 shows a block diagram of an exemplary power gating system 5 in an integrated circuit. The system 5 includes a plurality of memory banks 10a, 10b, . . . , 10n in a memory array. Each bank 10a-n is a segmented memory array portion of a large array and may be, for example, a 16 Kb and 32 wordline (WL) bank. Each respective bank 10a-n has an associated header circuit 15a-n that is configured to selectively activate and deactivate the bank to which it is connected. For example, header circuit 15a is operable to selectively activate and deactivate bank 10a, header circuit 15b is operable to selectively activate and deactivate bank 10b, and so on. With reference to header circuit 15a, each header circuit includes a first PFET 20a, a second PFET 25a, and an NFET 30a connected as shown in FIG. 1. Each respective first PFET 20a-n constitutes a single header device in the respective header circuit 15a-n. A voltage source VCS is connected to the source of the first PFET 20a. The drain of the first PFET 20a provides a virtual voltage V_VCSa to bank 10a. A drain of the second PFET 25a is connected to the drain of the NFET 30a (the source of NFET 30a is connected to ground) and the gate of the first PFET 20a, and provides a signal, GHEADa, to the gate of the first PFET 20a. A respective decode signal 35a-n is provided to the gate of the NFET 30a-n in each respective header circuit 15a-n.

Still referring to FIG. 1, a common bus 40 is connected to the source of the second PFET 25a-n of each respective header circuit 15a-n for providing an analog reference voltage signal GBIAS. A control circuit 45 that generates GBIAS includes a reference voltage generator 50, an operational amplifier (op-amp) 55, a control PFET 60, and a fixed mimic array 65 connected as shown in FIG. 1. The control PFET 60 is a scaled version of the individual first PFETs 20a-n in the header circuits 15a-n.

In operation, the system 5 controls the decode signals 35a-n to activate a single bank (e.g., 10a) and deactivate all other banks (e.g., 10b-n) at any given time. For example, during a particular cycle, decode signal 35a is set high (e.g., 1 or VCS) while decode signals 35b-n are set low (e.g., 0, ground, or VSS). This activates bank 10a and deactivates banks 10b-n. In a next cycle, decode signal 35b is set high, and all other decode signals (including 35a) are set low. In this manner, power is saved by deactivating all but one bank during any given cycle.

With continued reference to FIG. 1, the virtual voltage V_VCS equals VCS for an activated bank, and the virtual voltage V_VCS equals a retention voltage that is less than VCS for a deactivated bank. The bias signal GBIAS is used in conjunction with the size of the first PFETs 20a-n to set the level of V_VCS in the deactivated arrays, i.e., to the predefined retention voltage. For example, with reference to bank 10a, decode signal 35a may be set high to activate bank 10a. Decode signal 35a being high turns off second PFET 25a and turns on NFET 30a, which shunts GHEADa to ground or VSS. In this manner, the gate of first PFET 20a receives a ground (or VSS) input in the activated state. The ground input on the gate turns on first PFET 20a, which supplies VCS to V_VCSa. On the other hand, decode signal 35a may be set low to deactivate bank 10a. When decode signal 35a goes low, this turns on the second PFET 25a and turns off the NFET 30a, which applies the GBIAS signal to the gate of the first PFET 20a. In this manner, GHEADa is shunted to GBIAS and pulled up to the level of GBIAS. The level of GBIAS is controlled by the control circuit 45 to only slightly, but not fully, turn on the first PFET 20a. In this manner, the virtual voltage V_VCSa is kept above zero volts, but less than the full value of VCS. For example, when VCS is 1.0 volts, GBIAS may be controlled to make V_VCSa equal 0.6 volts when bank 10a is in the deactivated state, e.g., decode signal 35a is low.

In the system 5 shown in FIG. 1, the op-amp 55 supplies regulated voltage for the relatively large header devices, i.e., first PFETs 20a-n. Cycling across banks 10a-n (i.e. each bank 10a-n is activated and then deactivated) generates a large load on the op-amp 55 as each signal GHEADa-n is pulled up to the regulated voltage (e.g., GBIAS) from a lower voltage (e.g., VSS). There is DC current overhead from the op-amp 55, particularly with small arrays. Also, the header device AC switching current subtracts from potential leakage savings. For large arrays including a large number of banks, the GBIAS signal may have sufficient decoupling capacitance from deactivated banks to pull up the GHEAD signal of the bank that is transitioning from low (VSS) to the reference voltage (GBIAS) during a given cycle. However, for smaller arrays having less banks, there is not sufficient capacitance from other deactivated banks to help pull up the GHEAD signal of the bank that is transitioning from low to GBIAS, such that a large load is placed on the op-amp 55 during each cycle. The op-amp current does not scale, and additional external capacitance is required. Further, the fixed mimic array 65 results in diminished leakage savings as the base array is compiled in the WL/bitline (BL) direction.

Figure 2:
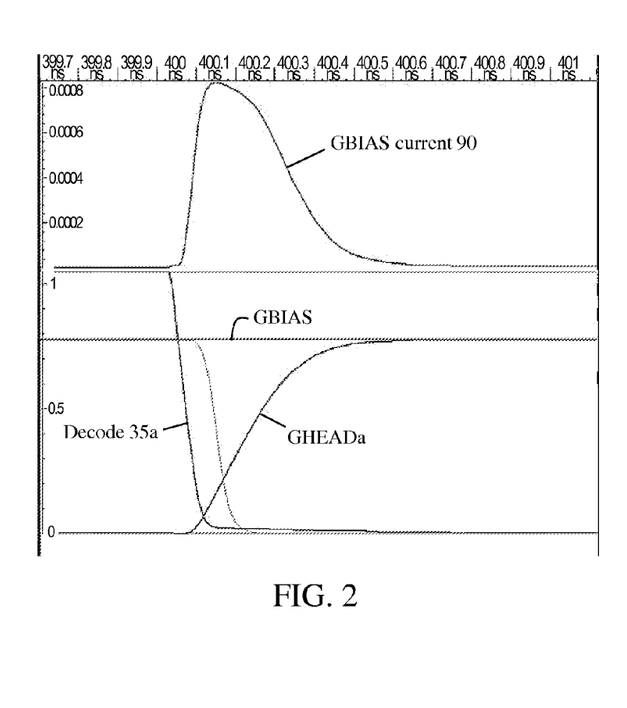
FIG. 2 shows a plot of signal levels associated with the circuit of FIG. 1.

FIG. 2 shows the GBIAS current 90 provided by the op-amp (e.g., op-amp 55) when a decode signal (e.g., decode signal 35a) goes from high to low when a bank (e.g., bank 10a) is deactivated. As shown in FIG. 2, there is a large draw of current on the op-amp in order to pull GHEADa from the low level to the higher GBIAS level.

Figure 3:
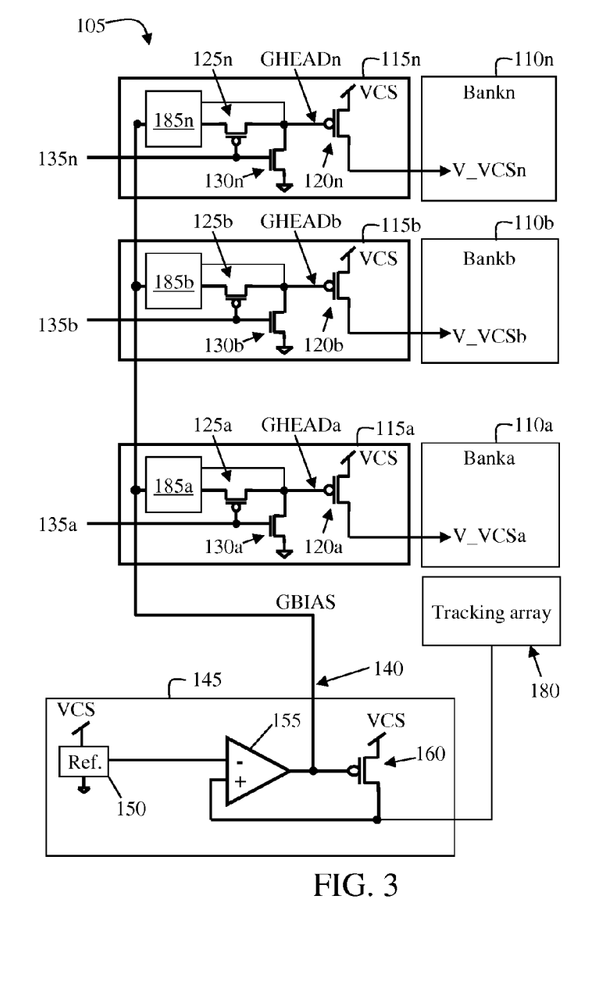
FIG. 3 shows a block diagram of an exemplary power gating system in an integrated circuit in accordance with aspects of the invention.

FIG. 3 shows a block diagram of an exemplary power gating system 105 in an integrated circuit in accordance with aspects of the invention. The system 105 includes a plurality of memory banks 110a, 110b, . . . , 110n, each of which represents a segmented memory array portion of a larger memory array. Each bank 110a-n may be, for example, a 16 Kb and 32 WL bank. The invention is not limited to this configuration, however, and any suitable type, size, and number of banks 110a-n may be used within the scope of the invention.

In embodiments, each respective bank 110a-n has an associated header circuit 115a-n that is configured to selectively activate and deactivate the bank to which it is connected. For example, header circuit 115a is operable to selectively activate and deactivate bank 110a, header circuit 115b is operable to selectively activate and deactivate bank 110b, and so on.

Each respective header circuit 115a-n may include a respective first PFET 120a-n, a respective second PFET 125a-n, and a respective NFET 130a-n connected as shown in FIG. 3. Each respective first PFET 120a-n constitutes a single header device for its associated header circuit 115a-n. Similar to system 5 of FIG. 1, each respective header circuit 115a-n provides a virtual voltage V_VCSa-n to its respective bank 110a-n. Also similar to system 5 of FIG. 1, a respective decode signal 135a-n is provided to each respective header circuit 115a-n to selectively activate and deactivate each header circuit 115a-n individually. Further similar to system 5 of FIG. 1, a common bus 140 is connected to each header circuit 115a-n, and a control circuit 145 generates a reference voltage GBIAS on the bus 140. In embodiments, the control circuit 145 includes a reference voltage generator 150, an op-amp 155, and a control PFET 160 connected as shown in FIG. 3.

In operation, the system 105 controls the decode signals 135a-n to activate a single bank (e.g., bank 110a) and deactivate all other banks (e.g., banks 110b-n) at any given time. For example, during a particular cycle, decode signal 135a is set high (e.g., 1 or VCS) while decode signals 135b-n are set low (e.g., 0, ground, or VSS). This activates bank 110a and deactivates banks 110b-n. In a next cycle, decode signal 135b may be set high, and all other decode signals (including 135a) are set low. In this manner, power is saved by deactivating all but one bank during any given cycle. In aspects of the invention, the virtual voltage V_VCS equals VCS for an activated bank, and the virtual voltage V_VCS is less than VCS for a deactivated bank. Similar to the system 5 of FIG. 1, the bias signal GBIAS may be configured in conjunction with the size of the first PFETs 120a-n to set a predefined level of V_VCS in the deactivated arrays, i.e., a retention voltage. In embodiments, the predefined retention voltage level of V_VCS in deactivated arrays is sufficiently smaller than VCS to achieve power savings, and sufficiently greater than 0 volts to prevent the deactivated bank from losing stored data. For example, VCS may be about 1.0 volts and V_VCS in deactivated banks may be about 0.6 volts; although the invention is not limited to these values and other suitable values may be used.

According to aspects of the invention, system 105 includes a tracking array 180 (e.g., a sample array) that is integrated with a functional array (e.g., bank 110a) for identical growability (e.g., scalability) along the WL direction (i.e. the number of BL will always be the same for both the tracking array and the functional array). In embodiments, the tracking array 180 is structured to vary along the WL dimension with the functional array, e.g., bank 110a, to adjust the regulated voltage (GBIAS) such that all array sizes maintain a constant retention voltage (V_VCS) during power gating. The constant retention voltage is independent of WL length and, thus, provides optimum leakage savings. In embodiments, the tracking array 180 is scaled relative to the individual functional arrays (e.g., banks 110a-n) using a same scaling factor as control PFET 160 to first PFETs 120a-n (i.e. the BL dimension or the number of WL of the functional array (e.g., bank 110a) will always be a scaled multiple of the BL dimension of the tracking array 180). In embodiments, the scaling factor is 8 or 16. For example, bank 110a may be 16 Kb (and PFET 120a may be 160 fins) and tracking array 180 may be 2 KB (and PFET 160 may be 20 fins), e.g., a scaling factor of 8. The invention is not limited to these values, however, and any suitable scaling factor may be used.

Figure 4:
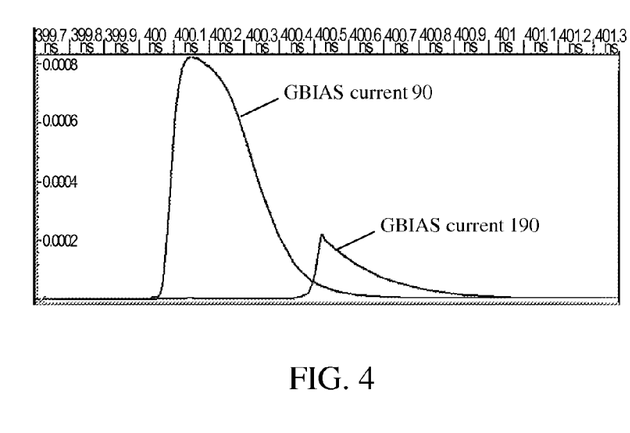
FIG. 4 shows a plot of signal levels associated with the circuit of FIG. 3.

According to aspects of the invention, each respective header circuit 115a-n includes a respective precharge circuit 185a-n that is structured and arranged to precharge the GHEAD signal to a predefined level prior to shunting GHEAD with GBIAS. In embodiments, the predefined level is a precharge voltage that is greater than ground and less than the regulated voltage (GBIAS). For example, the predefined level may be VCS minus a threshold voltage, e.g., VCS-Vt. In this manner, the GBIAS current load on op-amp 155 is reduced (e.g., compared to the system 5 of FIG. 1) when one of the banks 110a-n is switched from activated to deactivated. This is depicted in FIG. 4, which shows GBIAS current 90 for system 5 and GBIAS current 190 for system 105 when a bank is switched from activated to deactivated. As is evident from FIG. 4, system 105 in accordance with aspects of the invention provides a significant reduction of op-amp load current in power gating.

Figure 5:
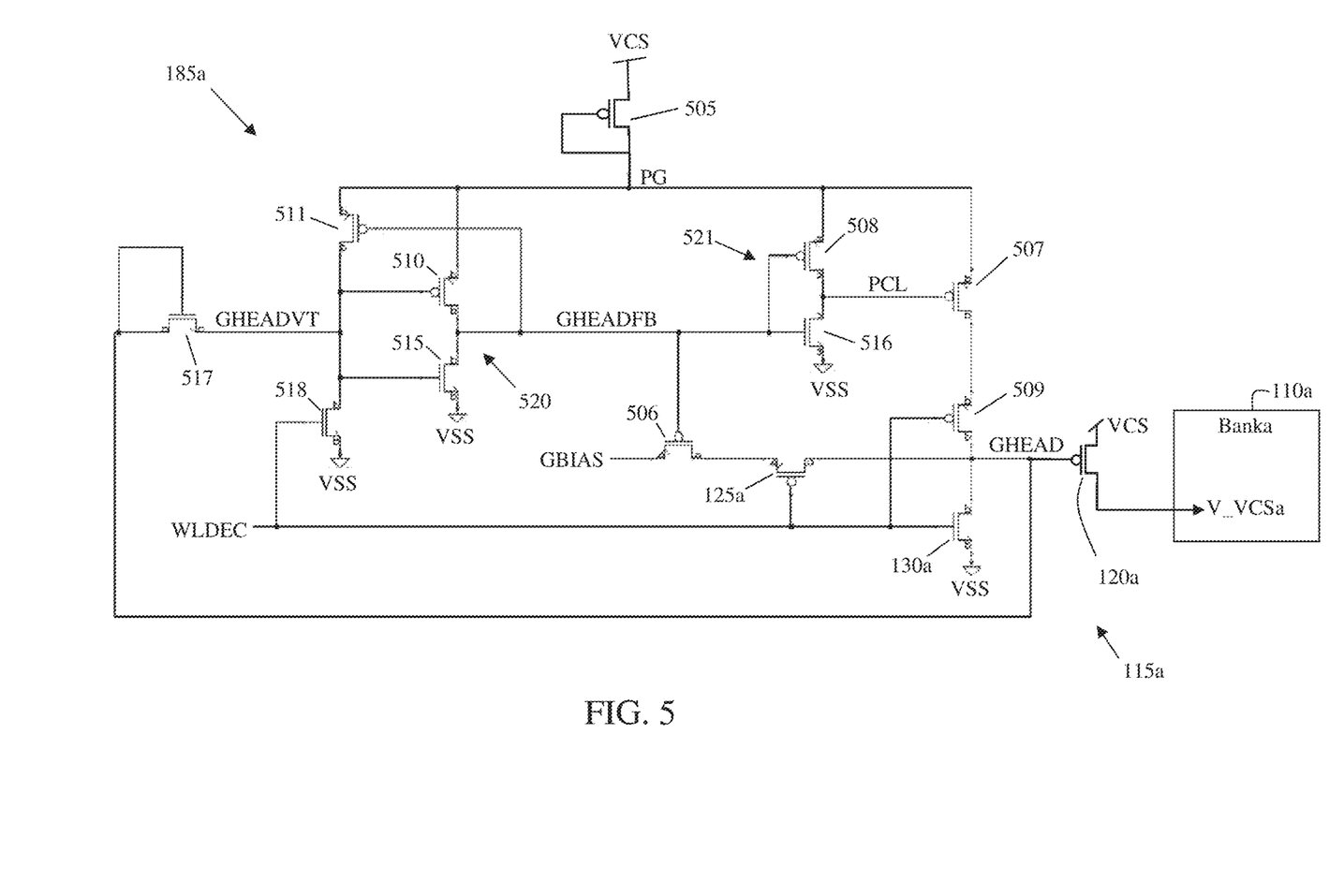
FIG. 5 shows an embodiment of a precharge circuit in accordance with aspects of the invention.
Figure 6:
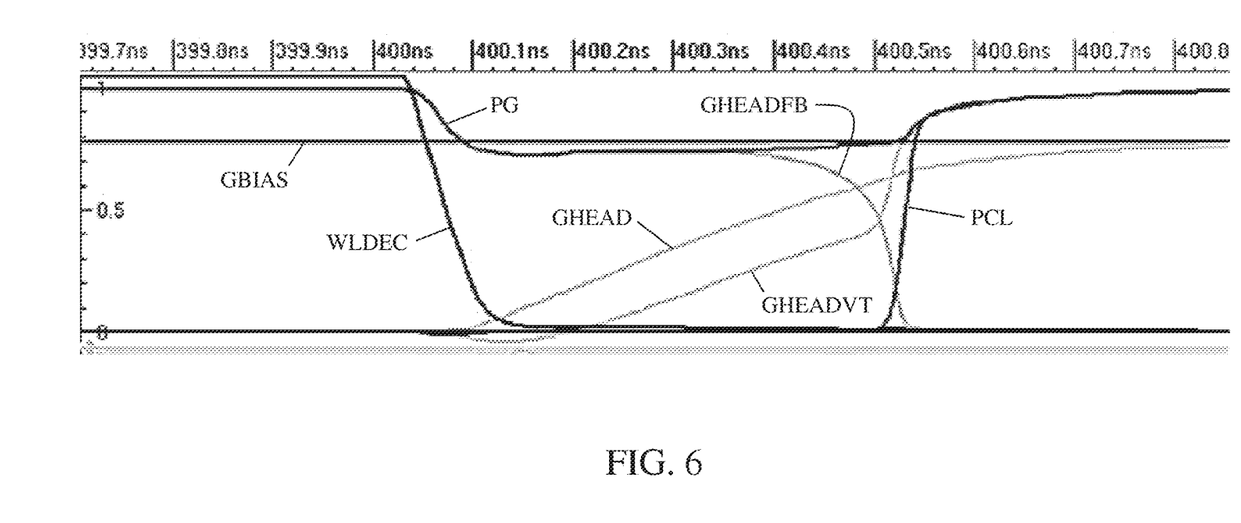
FIG. 6 shows a plot of signal levels corresponding to the circuit shown in FIG. 5.

FIG. 5 shows an embodiment of a precharge circuit 185a and a header circuit 115a (defined in FIG. 3 previously) in accordance with aspects of the invention. FIG. 6 shows a plot of various signal levels (e.g., voltages) versus time corresponding to the circuit shown in FIG. 5. Although only precharge circuit 185a is shown in FIG. 5, it is understood that precharge circuits 185b-n in system 105 of FIG. 3 may be implemented in a similar manner as precharge circuit 185a.

In FIGS. 5 and 6, the WLDEC signal is the decode signal 135a of FIG. 3, GBIAS is the GBIAS signal on bus 140 in FIG. 3, and GHEAD is the GHEADa signal at the gate of first PFET 120a. As shown in both FIGS. 3 and 5, the first PFET 120a provides a virtual voltage V_VCSa to bank 110a. With continued reference to FIGS. 5 and 6, PG is a global power gate control signal that is defined by VCS minus a threshold voltage Vt of diode connected PFET 505. Also, signals GHEADVT, GHEADFB, and PCL are signals at locations specified in FIG. 5, the levels of which are shown in FIG. 6.

In an embodiment, precharge circuit 185a includes PFETs 506-511 and NFETs 515-518 connected as shown in FIG. 5. In embodiments, the precharge circuit 185a includes at least one first switch (e.g., PFETS 507 and 509) connected between a precharge current source (e.g., PG) and the gate of the header device (e.g., PFET 120a), and at least one second switch (e.g., PFET 506) connected between the GBIAS bus and the gate of the header device. The operation of precharge circuit 185a is described with reference to FIGS. 5 and 6 as follows. WLDEC is initially high while bank 110a is activated, at which time GHEADa is low. WLDEC is set low (e.g., by a memory controller) to transition bank 110a from activated to deactivated in accordance with power gating principles.

According to aspects of the invention, when WLDEC transitions from high to low, the precharge circuit 185a is configured to precharge GHEAD using an alternate current source (i.e., PG) before shunting the GBIAS signal to GHEAD. In this manner, PG is used to pull up GHEAD from VSS to a level slightly less than GBIAS during the precharge, such as to avoid using GBIAS to pull up GHEAD entirely from VSS to GBIAS.

In particular, when WLDEC goes low, NFET 130a turns off and PFET 509 turns on. PFET 507 is already on due to PCL remaining low from the activated state. As such, a path is connected from PG to GHEAD, such that GHEAD is precharged (e.g., pulled up) by current flow from PG. GHEADVT rises with GHEAD, but lagging by an offset voltage that is defined by diode connected NFET 517. PG continues to pull up GHEAD and GHEADVT until GHEADVT passes a trip point (e.g., trigger point) of an inverter 520 defined by PFET 510 and NFET 515. An output of the inverter 520, GHEADFB, was initially high when WLDEC was high. When WLDEC transitions low, GHEADFB goes low when GHEADVT trips the inverter 520, and this turns on PFET 506. GHEADFB going low also trips inverter 521 defined by PFET 508 and NFET 516, and an output PCL of the inverter 521 goes high and turns off PFET 507. As such, when GHEADFB goes low, PG is disconnected from GHEAD by turning off PFET 507, and GBIAS is connected to GHEAD by turning on PFET 506. At this point, GHEAD is shunted to GBIAS and pulled up to the level of GBIAS by current supplied by the op-amp (e.g., op-amp 155 of control circuit 145 of FIG. 3).

As described with respect to FIGS. 5 and 6, aspects of the invention operate to precharge GHEAD to a predefined level (e.g., a precharge voltage) that is greater than ground and less than GBIAS using a precharge voltage source other than the op-amp of the GBIAS control circuit. Upon reaching the predefined level, GHEAD is disconnected from the precharge voltage source and connected to GBIAS. In this manner, the load on the op-amp is reduced, e.g., compared to system 5 of FIG. 1. The predefined level of the precharge voltage may be set using the trip point of inverter 520.

Figure 7:
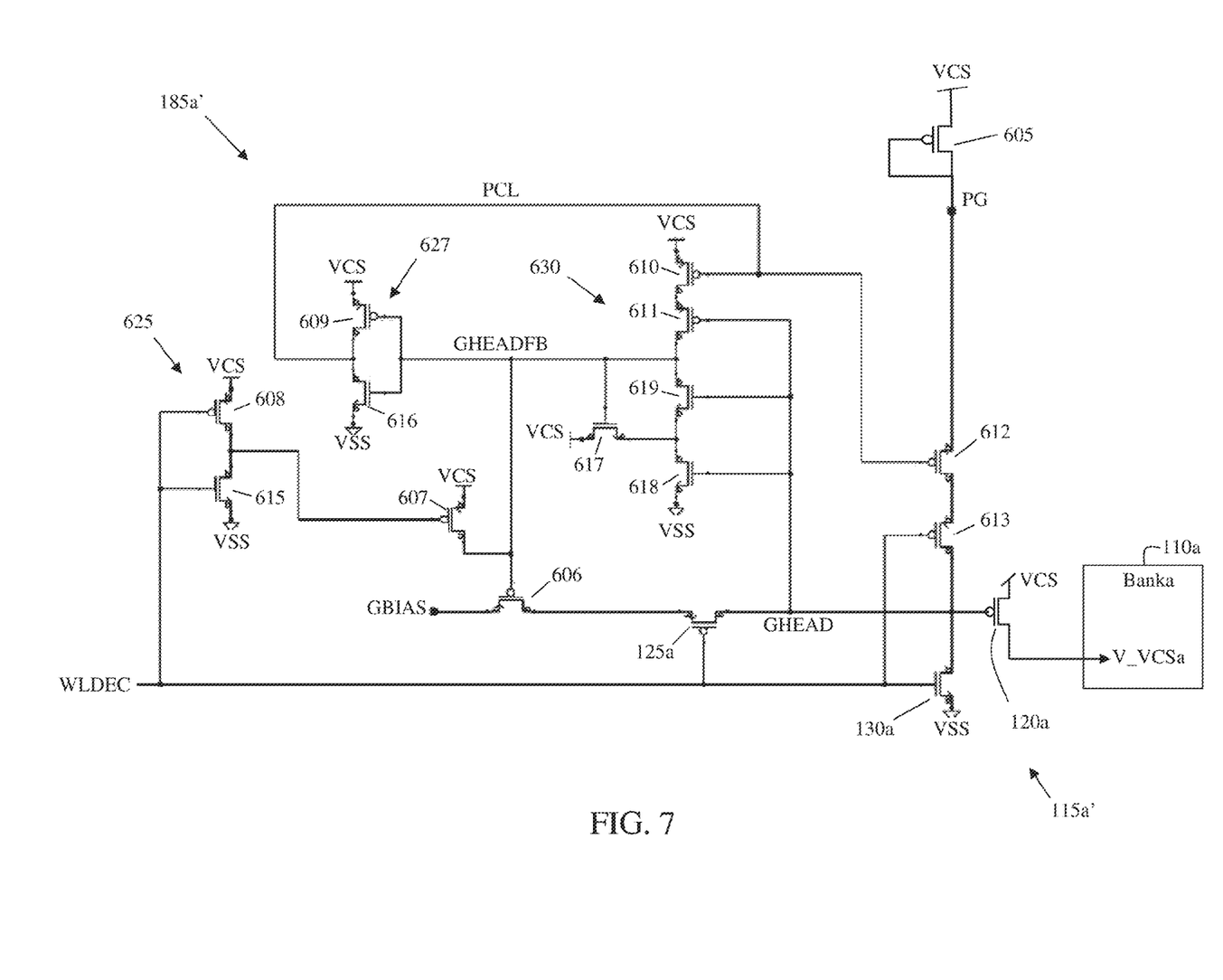
FIG. 7 shows an embodiment of a precharge circuit in accordance with aspects of the invention.
Figure 8:
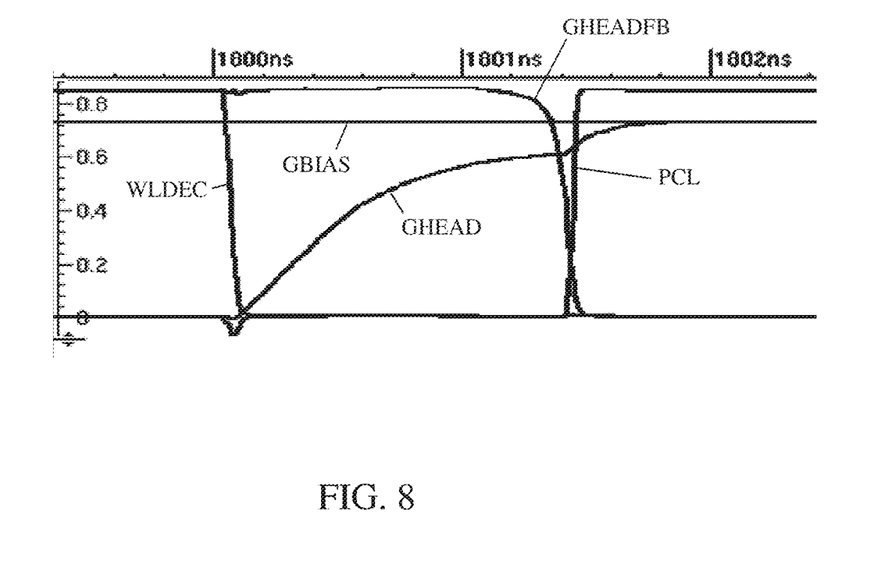
FIG. 8 shows a plot of signal levels corresponding to the circuit shown in FIG. 7.

FIG. 7 shows another embodiment of a precharge circuit 185a' and a header circuit 115a' in accordance with aspects of the invention. FIG. 8 shows a plot of various signal levels (e.g., voltages) versus time corresponding to the circuit shown in FIG. 7. Precharge circuit 185a' shown in FIG. 7 may be used as the precharge circuits 185a-n in system 105 of FIG. 3.

In FIGS. 7 and 8, the WLDEC signal is the decode signal 135a of FIG. 3, GBIAS is the GBIAS signal on bus 140 in FIG. 3, and GHEAD is the GHEADa signal at the gate of first PFET 120a. As shown in both FIGS. 3 and 7, the first PFET 120a provides a virtual voltage V_VCSa to bank 110a. With continued reference to FIGS. 7 and 8, PG is a global power gate control signal that is defined by VCS and a threshold voltage Vt of diode connected PFET 605. Also, signals GHEADFB and PCL are signals at locations specified in FIG. 7, the levels of which are shown in FIG. 8.

In an embodiment, precharge circuit 185a' includes PFETs 606-613 and NFETs 615-619 connected as shown in FIG. 7. In embodiments, the precharge circuit 185a' includes at least one first switch (e.g., PFETS 612 and 613) connected between a precharge current source (e.g., PG) and the gate of the header device (e.g., PFET 120a), and at least one second switch (e.g., PFET 606) connected between the GBIAS bus and the gate of the header device. The operation of precharge circuit 185a' is described with reference to FIGS. 7 and 8 as follows. WLDEC is initially high while bank 110a is activated, at which time GHEAD is low. WLDEC is set low (e.g., by a memory controller) to transition bank 110a from activated to deactivated in accordance with power gating principles.

According to aspects of the invention, when WLDEC transitions from high to low, the precharge circuit 185a' is configured to precharge GHEAD using PG before shunting GBIAS to GHEAD. In this manner, PG is used to pull up GHEAD during a precharge, such as to avoid using GBIAS to pull up GHEAD entirely from VSS to GBIAS.

As shown in FIGS. 7 and 8, GHEADFB is initially high when WLDEC is high, i.e., by operation of PFET 607 and an inverter 625 defined by PFET 608 and NFET 615. GHEADFB being high turns off PFET 606 and sets PCL low by way of an inverter 627 defined by PFET 609 and NFET 616. PCL being low turns on PFET 612. Thus, when WLDEC is initially high, PFET 606 is off and PFET 612 is on.

When WLDEC transitions from high to low, PFET 613 is turned on and connects a path between PG and GHEAD. As such, GHEAD is precharged (e.g., pulled up) by current flow from PG. GHEAD is tied to the input of a Schmitt Trigger 630 defined by PFETs 610, 611 and NFETs 617-619. When GHEAD rises past the trip point of the Schmitt Trigger 630, the output of the Schmitt Trigger 630 (i.e., GHEADFB) flips from high to low. GHEADFB going low sets PCL high via inverter 627, which turns off PFET 612 and disconnects PG from GHEAD. GHEADFB going low also turns on PFET 606, which connects GBIAS to GHEAD. At this point, GHEAD is no longer being charged by PG, but rather is shunted to GBIAS. In this manner, implementations of the invention precharge GHEAD to a precharge voltage using an alternate source (i.e., a source other than GBIAS). After the precharge, the charging of GHEAD is completed using GBIAS. The predefined level of the precharge voltage may be set using the trip point of Schmitt Trigger 630. This precharge scheme reduces the load on the GBIAS generator, e.g., in a manner similar to the circuit described with respect to FIGS. 5 and 6.

Figure 9:
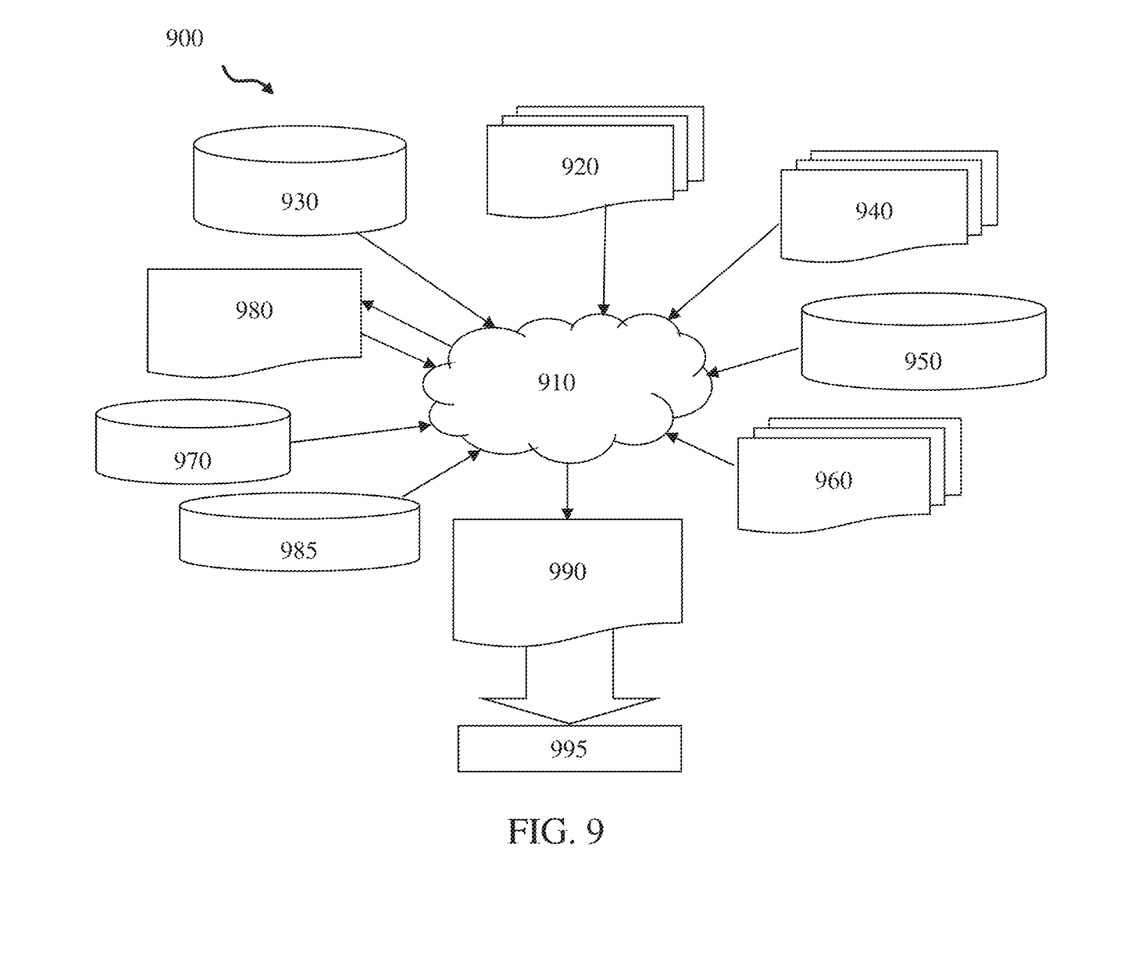
FIG. 9 is a flow diagram of a design process used in semiconductor design, manufacture, and/or test.

FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 3, 5, and 7. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 3, 5, and 7. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 3, 5, and 7 to generate a Netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments shown in FIGS. 3, 5, and 7. In one embodiment, design structure 990 may comprise a compiled, executable HDL simulation model that functionally simulates the devices shown in FIGS. 3, 5, and 7.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 3, 5, and 7. Design structure 990 may then proceed to a stage 995 where, for example, design structure 990: proceeds to tape-out, is released to manufacturing, is released to a mask house, is sent to another design house, is sent back to the customer, etc.

The method(s) described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit for an integrated circuit power gating system, the circuit comprising:
   a header device connected to a bank of a segmented memory array, wherein the circuit is structured and arranged to: apply a ground input to a gate of the header device to activate the bank, and apply a regulated voltage to the gate of the header device to deactivate the bank; and
   a precharge circuit that charges the gate of the header device to a precharge voltage that is greater than ground and less than the regulated voltage,
   wherein the circuit is connected to a bus at the regulated voltage; and
   the circuit applies the regulated voltage to the gate of the header device by shunting the gate of the header device to the bus.

2. The circuit of claim 1, wherein the precharge circuit charges the gate of the header device to the precharge voltage prior to the circuit shunting the gate of the header device to the bus.

3. The circuit of claim 1, wherein:
an operational amplifier of a control circuit provides the regulated voltage on the bus; and
the precharge circuit charges the gate of the header device using a source other than the operational amplifier.

4. The circuit of claim 3, wherein the precharge circuit comprises:
a first switch connected between the other source and the gate of the header device; and
a second switch connected between the bus and the gate of the header device.

5. The circuit of claim 3, wherein the other source comprises a global power gate control.

6. An integrated circuit power gating system, comprising:
a segmented memory array comprising a plurality of banks;
a respective header circuit associated with each respective one of the plurality of banks; and
a common bus connected to each said respective header circuit,
wherein each said respective header circuit comprises a header device connected to an associated one of the plurality of banks;
each said respective header circuit is structured and arranged to: apply a ground input to a gate of the header device to activate the associated one of the plurality of banks, and apply a regulated voltage to the gate of the header device to deactivate the associated one of the plurality of banks;
each said respective header circuit comprises a precharge circuit that charges the gate of the header device to a precharge voltage that is greater than ground and less than the regulated voltage; and
the header circuit applies the regulated voltage to the gate of the header device by shunting the gate of the header device to the common bus.

7. The system of claim 6, wherein the precharge circuit charges the gate of the header device to the precharge voltage prior to the header circuit shunting the gate of the header device to the bus.

8. The system of claim 6, further comprising a control circuit that generates the regulated voltage on the common bus.

9. The system of claim 6, further comprising a tracking array integrated with one of the plurality of banks.

10. An integrated circuit power gating system, comprising:
a segmented memory array comprising a plurality of banks;
a respective header circuit associated with each respective one of the plurality of banks;
a common bus connected to each said respective header circuit; and
a control circuit that generates a regulated voltage on the common bus,
wherein each said respective header circuit comprises a header device connected to an associated one of the plurality of banks;
each said respective header circuit is structured and arranged to: apply a ground input to a gate of the header device to activate the associated one of the plurality of banks, and apply the regulated voltage to the gate of the header device to deactivate the associated one of the plurality of banks;
each said respective header circuit comprises a precharge circuit that charges the gate of the header device to a precharge voltage that is greater than ground and less than the regulated voltage; and
the control circuit comprises a reference voltage generator, an operational amplifier, and a scaled header device.

11. The system of claim 10, wherein the precharge circuit charges the gate of the header device using a source other than the operational amplifier.

12. The system of claim 11, wherein the other source comprises a global power gate control.

13. An integrated circuit power gating system, comprising:
a segmented memory array comprising a plurality of banks;
a respective header circuit associated with each respective one of the plurality of banks; and
a tracking array integrated with one of the plurality of banks,
wherein each said respective header circuit comprises a header device connected to an associated one of the plurality of banks;
each said respective header circuit is structured and arranged to: apply a ground input to a gate of the header device to activate the associated one of the plurality of banks, and apply a regulated voltage to the gate of the header device to deactivate the associated one of the plurality of banks;
each said respective header circuit comprises a precharge circuit that charges the gate of the header device to a precharge voltage that is greater than ground and less than the regulated voltage; and
the tracking array is smaller than the one of the plurality of banks by a predefined scale factor.

14. A method of power gating in an integrated circuit, comprising:
precharging a gate of a header device connected to a bank of a segmented memory array prior to applying a regulated voltage to the gate of the header device, wherein the precharging raises the gate of the header device to a voltage level greater than ground and less than the regulated voltage; and
shunting the gate of the header device to a bus maintained at the regulated voltage after the precharging.

15. The method of claim 14, further comprising:
applying the regulated voltage to the bus using an amplifier; and
performing the precharging using a source other than the amplifier.

16. The method of claim 15, further comprising performing the precharging based on a decode signal transitioning from one level to another level, wherein the applying the regulated voltage to the gate of the header device deactivates the bank of the segmented memory array.

* * * * *